(12) United States Patent
Darolia et al.

(10) Patent No.: US 6,291,084 B1
(45) Date of Patent: Sep. 18, 2001

(54) NICKEL ALUMINIDE COATING AND COATING SYSTEMS FORMED THEREWITH

(75) Inventors: Ramgopal Darolia, West Chester; Joseph David Rigney, Milford; Richard John Grylls, Cincinnati, all of OH (US)

(73) Assignee: General Electric Company, Cincinnati, OH (US)

( * ) Notice: Subject to any disclaimer, the term of this patent is extended or adjusted under 35 U.S.C. 154(b) by 0 days.

(21) Appl. No.: 09/608,114

(22) Filed: Jun. 30, 2000

Related U.S. Application Data

(63) Continuation-in-part of application No. 09/166,883, filed on Oct. 6, 1998, now Pat. No. 6,153,313.

(51) Int. Cl.$^7$ .................................................. B32B 15/00
(52) U.S. Cl. ...................... 428/633; 428/621; 428/652; 428/680; 416/241 R; 416/241 B
(58) Field of Search .................................. 428/621, 632, 428/633, 652, 680; 416/241 R, 241 B; 420/442, 445

(56) References Cited

U.S. PATENT DOCUMENTS

| Re. 33,876 | 4/1992 | Goward et al. | 428/633 |
|---|---|---|---|
| 4,530,885 | 7/1985 | Restall | 428/670 |
| 4,610,736 * | 9/1986 | Barrett et al. | 148/429 |
| 4,612,165 | 9/1986 | Liu et al. | 420/459 |
| 4,731,221 | 3/1988 | Liu | 420/445 |
| 4,916,022 | 4/1990 | Solfest et al. | 428/623 |
| 5,108,700 | 4/1992 | Liu | 420/445 |
| 5,116,438 | 5/1992 | Darolia et al. | 148/404 |
| 5,116,691 * | 5/1992 | Darolia et al. | 428/614 |
| 5,215,831 | 6/1993 | Darolia et al. | 428/614 |
| 5,238,752 | 8/1993 | Duderstadt et al. | 428/623 |
| 5,302,465 | 4/1994 | Miller et al. | 428/552 |
| 5,427,866 | 6/1995 | Nagaraj et al. | 428/610 |
| 5,516,380 | 5/1996 | Darolia et al. | 148/404 |
| 5,824,423 | 10/1998 | Maxwell et al. | 428/623 |
| 5,975,852 * | 11/1999 | Nagaraj et al. | 416/241 R |
| 6,168,874 * | 1/2001 | Gupta et al. | 428/623 |

FOREIGN PATENT DOCUMENTS

WO 97/29219   8/1997   (WO) ............................ C23C/28/00

OTHER PUBLICATIONS

Pint et al., *Evaluation of TBC–Coated–NiAl Substrates Without a Bond Coat*, Elevated Temperature Coatings: Science and Tech. II, The Minerals, Metals and Materials Society, (1996), pp.163–173.

Pint et al., *Substrate and Bond Coat Compositions: Factors Affecting Alumina Scale Adhesion*, NIST TBC Workshop 1997, Cincinnati OH (May 19–21, 1997), pp. 109–125.

* cited by examiner

Primary Examiner—Deborah Jones
Assistant Examiner—Bryant Young
(74) Attorney, Agent, or Firm—Andrew C. Hess; David L. Narciso

(57) ABSTRACT

An environmental overlay coating for articles used in hostile thermal environments, such as turbine, combustor and augmentor components of a gas turbine engine. The overlay coating is predominantly beta-phase NiAl with limited alloying additions of zirconium and chromium. The overlay coating is useful as an environmental coating and as a bond coat that improves the spallation resistance of a thermal barrier coating (TBC) system.

16 Claims, 3 Drawing Sheets

US 6,291,084 B1

NICKEL ALUMINIDE COATING AND COATING SYSTEMS FORMED THEREWITH

CROSS REFERENCE TO RELATED APPLICATIONS

This is a continuation-in-part patent application of U.S. patent application Ser. No. 09/166,883 filed Oct. 6, 1998 now U.S. Pat. No. 6,153,313.

FIELD OF THE INVENTION

This invention relates to coatings of the type used to protect components exposed to high temperature environments, such as the hostile thermal environment of a gas turbine engine. More particularly, this invention is directed to a predominantly beta (β) phase NiAl overlay coating that is alloyed to exhibit enhanced environmental properties, and as a result is useful as an environmental coating and as a bond coat for a thermal insulating ceramic layer.

BACKGROUND OF THE INVENTION

Higher operating temperatures for gas turbine engines are continuously sought in order to increase their efficiency. However, as operating temperatures increase, the high temperature durability of the components within the engine must correspondingly increase. Significant advances in high temperature capabilities have been achieved through the formulation of nickel and cobalt-base superalloys. Nonetheless, when used to form components of the turbine, combustor and augmentor sections of a gas turbine engine, such alloys alone are often susceptible to damage by oxidation and hot corrosion attack and may not retain adequate mechanical properties. For this reason, these components are often protected by an environmental and/or thermal-insulating coating, the latter of which is termed a thermal barrier coating (TBC) system.

Diffusion coatings, such as diffusion aluminides and particularly platinum aluminides (PtAl), and overlay coatings, particularly MCrAlY alloys (where M is iron, cobalt and/or nickel), have been widely employed as environmental coatings for gas turbine engine components. Ceramic materials such as zirconia ($ZrO_2$) partially or fully stabilized by yttria ($Y_2O_3$), magnesia (MgO) or other oxides, are widely used as a topcoat of TBC systems used on gas turbine engine components. The ceramic layer is typically deposited by air plasma spraying (APS) or a physical vapor deposition (PVD) technique. TBC employed in the highest temperature regions of gas turbine engines is typically deposited by electron beam physical vapor deposition (EBPVD) techniques which yield a columnar grain structure that is able to expand and contract without causing damaging stresses that lead to spallation.

To be effective, thermal barrier coatings must have low thermal conductivity, strongly adhere to the article, and remain adherent throughout many heating and cooling cycles. The latter requirement is particularly demanding due to the different coefficients of thermal expansion between thermal barrier coating materials and superalloys typically used to form turbine engine components. Thermal barrier coating systems capable of satisfying the above requirements have generally required a bond coat, typically one or both of the above-noted diffusion aluminide and MCrAlY coatings. The aluminum content of a bond coat formed from these materials provides for the slow growth of a strong adherent continuous aluminum oxide layer (alumina scale) at elevated temperatures. This thermally grown oxide (TGO) protects the bond coat from oxidation and hot corrosion, and chemically bonds the ceramic layer to the bond coat. However, a thermal expansion mismatch exists between the metallic bond coat, alumina scale and ceramic layer, and peeling stresses generated by this mismatch gradually increase over time to the point where spallation can occur at the interface between the bond coat and alumina scale or the interface between the alumina scale and ceramic layer.

Furthermore, though bond coat materials are particularly alloyed to be oxidation-resistant, the surface oxidation and interdiffusion (with the substrate) that occurs over time at elevated temperatures gradually deplete aluminum from the bond coat. Eventually, the level of aluminum within the bond coat can become sufficiently depleted to prevent further slow growth of the protective alumina scale and to allow for the more rapid growth of nonprotective oxides, the result of which again is spallation of the ceramic layer. In addition to depletion of aluminum, the ability of the bond coat to form the desired alumina scale can be hampered by the interdiffusion of certain elements between the superalloy and bond coat, such as during formation of a diffusion aluminide coating and during high temperature exposure.

From the above, it is apparent that the service life of a TBC system is dependent on the bond coat used to anchor the thermal insulating ceramic layer. Consequently, considerable research has been directed toward improved bond coats for TBC systems, including efforts directed to the use of oxidation-resistant materials other than diffusion aluminide coatings and MCrAlY overlay coatings. One example is bond coats formed of an overlay coating (i.e., not a diffusion) of beta (β) phase nickel aluminide (NiAl) intermetallic, whose composition is about 50 atomic percent (about 30 weight percent) aluminum, the balance being nickel. In the past, gas turbine engine components formed of NiAl intermetallic have been proposed. For example, advanced NiAl intermetallic alloys are reported in commonly-assigned U.S. Pat. Nos. 5,116,438, 5,116,691, 5,215,831 and 5,516,380 as suitable for forming load-bearing gas turbine engine components. These patents are primarily concerned with alloying the NiAl intermetallic to improve high temperature mechanical strength and low temperature ductility, neither of which is of particular concern for TBC bond coats, since bond coats are deposited as sacrificial layers on the outer surfaces of components and do not contribute to the strength of the components. NiAl intermetallic has also been proposed as an environmental coating in U.S. Pat. No. 4,610,736 to Barrett et al., in which additions of about 0.05 to 0.25 weight percent zirconium were shown to improve the cyclic oxidation resistance of the intermetallic, though whether such a coating could be used as a bond coat for a TBC system was not reported or evident.

More recently, in commonly-assigned U.S. patent application Ser. No. 09/232,518, filed Jan. 19, 1999, to Darolia, a beta-phase nickel aluminide bond coat containing 0.2 up to about 0.5 atomic percent zirconium is reported to promote the adhesion of a ceramic TBC layer to the extent that the service life of the resulting TBC system is drastically increased. Darolia also teaches that minimizing the diffusion zone between a NiAl bond coat and its underlying substrate promotes the formation of an initial layer of essentially pure aluminum oxide, promotes the slow growth of the protective aluminum oxide layer during service, and reduces the formation of voluminous nonadherent oxides of substrate constituents that tend to diffuse into the bond coat, such as nickel, cobalt, chromium, titanium, tantalum, tungsten and molybdenum. As such, Darolia teaches that NiAl bond coats can perform extremely well as a bond coat for a TBC if properly alloyed and deposited to contain only NiAl intermetallic and zirconium. Notably, Darolia subscribes to the conventional wisdom that alloying additions of chromium, titanium and tantalum to a bond coat detrimentally encourage the growth of alumina scale, leading to reduced spallation life of a ceramic layer on the bond coat. Consequently, it is apparent that the alloying requirements of NiAl intermetallic intended as an environmental coating or TBC bond coat differ from that of NiAl intermetallic used to form load-bearing articles, such as those of previously-mentioned U.S. Pat. No. 5,516,380.

Even with the advancements of Darolia, there remains a considerable and continuous effort to further increase the service life of TBC systems by improving the spallation resistance of the thermal insulating layer.

BRIEF SUMMARY OF THE INVENTION

The present invention generally provides a protective overlay coating for articles used in hostile thermal environments, such as turbine, combustor and augmentor components of a gas turbine engine. The method is particularly directed to increasing the environmental resistance of a predominantly beta-phase NiAl overlay coating for use as an environmental coating, as well as to improve the spallation resistance of a thermal barrier coating (TBC) deposited on the surface of such an overlay coating. According to the invention, an unexpected improvement in spallation resistance and cyclic hot corrosion/oxidation (CHC/O) resistance is achieved with beta-phase NiAl overlay bond coats alloyed to contain certain amounts of chromium and zirconium, in combination, as compared to prior art beta-phase NiAl environmental coatings and TBC bond coats.

As a beta-phase NiAl intermetallic, the overlay coating of this invention contains 30 to 60 atomic percent aluminum so as to be predominantly of the beta-NiAl phase. As a key feature of this invention, the overlay coating also contains about 2 to 15 atomic percent chromium and about 0.1 to 1.2 atomic percent zirconium, which when present together in a beta-phase NiAl overlay bond coat, have been shown to improve the spallation resistance of a TBC deposited on the overlay bond coat. In the presence of chromium, the maximum level at which zirconium produces a beneficial effect is significantly increased as compared to prior art NiAl+Zr overlay coatings. Also of particular note is that the inclusion of limited amounts of chromium unexpectedly has a very substantial effect on spallation resistance, contrary to conventional wisdom that significant additions of chromium to beta-phase NiAl detrimentally encourages the growth of alumina scale and reduce spallation life. The net effect of the amounts of chromium and zirconium proposed by this invention is a significant improvement in cyclic hot corrosion and oxidation (CHC/O) performance of the overlay coating of this invention, and an increase in the life of a TBC on the overlay coating.

Notably, the NiAl overlay coating of this invention also exhibits sufficient CHC/O resistance to survive numerous cycles after spallation of the TBC has occurred. Accordingly, in addition to being suitable as a bond coat for a TBC system, the protective beta-phase NiAl overlay coating of this invention also has application as an environmental coating.

Other objects and advantages of this invention will be better appreciated from the following detailed description.

DETAILED DESCRIPTION OF THE INVENTION

Figure 1:
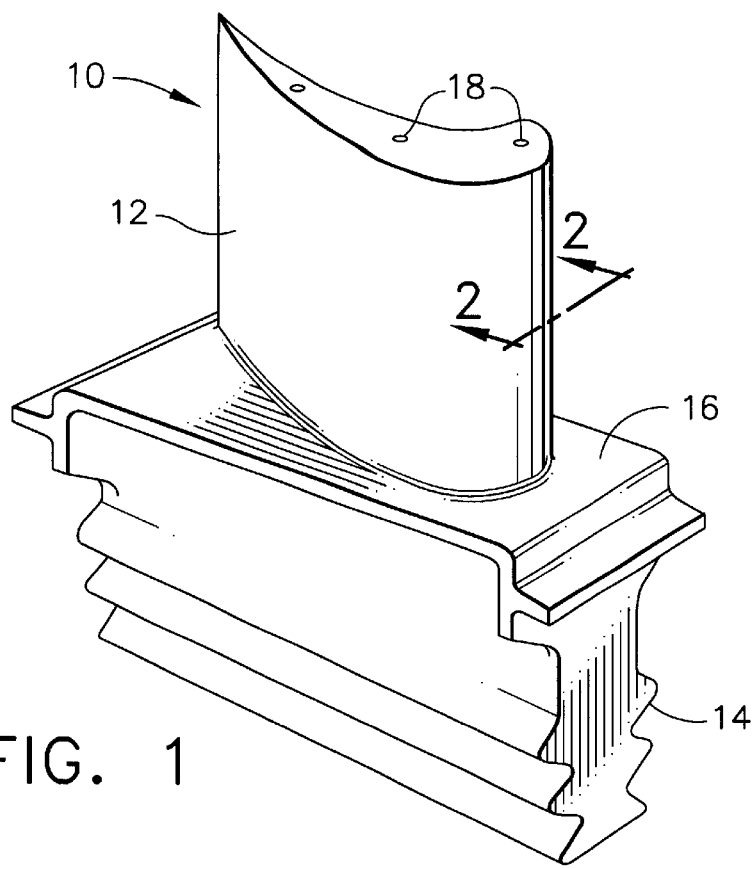
FIG. 1 is a perspective view of a high pressure turbine blade.

The present invention is generally applicable to components that operate within environments characterized by relatively high temperatures, and are therefore subjected to severe thermal stresses and thermal cycling. Notable examples of such components include the high and low pressure turbine nozzles and blades, shrouds, combustor liners and augmentor hardware of gas turbine engines. One such example is the high pressure turbine blade 10 shown in FIG. 1. The blade 10 generally includes an airfoil 12 against which hot combustion gases are directed during operation of the gas turbine engine, and whose surface is therefore subjected to severe attack by oxidation, corrosion and erosion. The airfoil 12 is anchored to a turbine disk (not shown) with a dovetail 14 formed on a root section 16 of the blade 10. Cooling holes 18 are present in the airfoil 12 through which bleed air is forced to transfer heat from the blade 10. While the advantages of this invention will be described with reference to the high pressure turbine blade 10 shown in FIG. 1, and particularly nickel-base superalloy blades of the type shown in FIG. 1, the teachings of this invention are generally applicable to any component on which a coating system may be used to protect the component from its environment.

Figure 2:
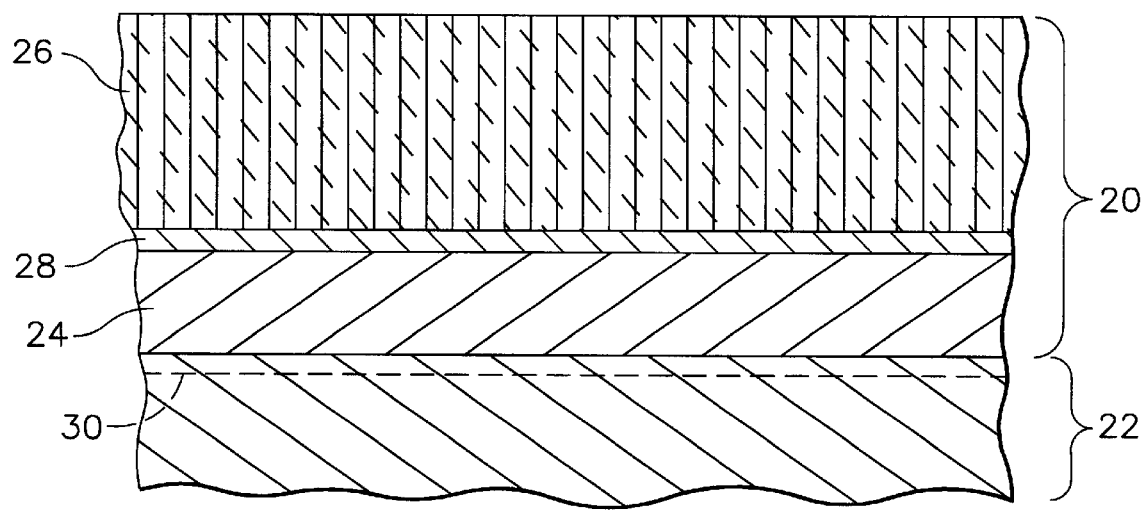
FIG. 2 is a cross-sectional view of the blade of FIG. 1 along line 2—2, and shows a thermal barrier coating system on the blade in accordance with an embodiment of this invention.

Represented in FIG. 2 is a TBC system 20 of a type that benefits from the teachings of this invention. As shown, the coating system 20 includes a ceramic layer 26 bonded to the blade substrate 22 with a NiAl overlay coating 24, which therefor serves as a bond coat to the ceramic layer 26. The substrate 22 (blade 10) is preferably a high-temperature material, such as an iron, nickel or cobalt-base superalloy. To attain a strain-tolerant columnar grain structure, the ceramic layer 26 is preferably deposited by physical vapor deposition (PVD), though other deposition techniques could be used. A preferred material for the ceramic layer 26 is an yttria-stabilized zirconia (YSZ), with a suitable composition being about 3 to about 20 weight percent yttria, though other ceramic materials could be used, such as yttria, nonstabilized zirconia, or zirconia stabilized by ceria ($CeO_2$), scandia ($Sc_2O_3$) or other oxides. The ceramic layer 26 is deposited to a thickness that is sufficient to provide the required thermal protection for the underlying substrate 22 and blade 10, generally on the order of about 100 to about 300 micrometers. As with prior art TBC systems, the surface of the overlay coating 24 oxidizes to form an oxide surface layer (scale) 28 to which the ceramic layer 26 chemically bonds.

According to the invention, the NiAl overlay coating 24 is predominantly of the beta (β) NiAl phase with limited alloying additions. The NiAl overlay coating 24 is formed using a PVD process, preferably magnetron sputter physical vapor deposition or electron beam physical vapor deposition (EBPVD), though it is foreseeable that other deposition techniques could be used, such as thermal spraying of powders. According to the invention, an adequate thickness for the overlay coating 24 is about 15 micrometers in order to protect the underlying substrate 22 and provide an adequate supply of aluminum for oxide formation, though thicknesses of about 10 to about 125 micrometers are believed to be suitable. The above PVD techniques are preferably carried out to reduce the diffusion of the overlay coating 24 into the substrate 22. Preferably, deposition of the overlay coating 24 results in virtually no diffusion between the overlay coating 24 and substrate 22. During subsequent heat treatment to relieve residual stresses generated during the deposition process, a very thin diffusion zone 30 of not more than about five micrometers, typically about 2.5 to 5 micrometers, may develop. A suitable heat treatment is two to four hours at about 1800° F. to 2000° F. (about 980° C. to about 1090° C.) in a vacuum or an inert atmosphere such as argon. Importantly, the minimal thickness of the diffusion zone 30 promotes the initial formation of the scale 28 as essentially pure aluminum oxide (alumina), promotes the slow growth of the protective alumina scale 28 during service, reduces the formation of voluminous nonadherent oxides at the bond coat-ceramic layer interface, and reduces the amount of substrate material that must be removed during refurbishment of the TBC system 20. Accordingly, articles such as the blade 10 shown in FIG. 1 can be refurbished more times than would be possible if a diffusion bond coat were used.

To attain the beta-NiAl intermetallic phase, the NiAl overlay coating 24 of this invention has an aluminum content of about 30 to 60 atomic percent, preferably about 30 to 50 atomic percent, and more preferably at an atomic ratio of 1:1 with nickel. According to this invention, the addition of about 2 to 15 atomic percent chromium and about 0.1 to 1.2 atomic percent zirconium to the predominantly beta-phase NiAl overlay coating 24 has a significant effect on the spallation resistance of the ceramic layer 26 adhered to the overlay coating 24 to form the TBC system 20.

According to the invention, additions of chromium and zirconium have been shown to improve the spallation resistance of a ceramic layer deposited on the NiAl overlay coating the overlay coating 24, and to improve the cyclic hot corrosion/oxidation (CHC/O) resistance of the overlay coating 24 when used alone as an environmental coating. These benefits have been shown to be the result of solid solution strengthening by chromium, and precipitation strengthening from fine α-Cr phases or β' Heusler phases (in combination with additions of zirconium) dispersed within the beta phase of the bond coat. The result is believed to be a sufficient increase in the strength of the bond coat to limit the creep deformation and rumpling of the bond coat surface, which this invention has determined to contribute to early failures of conventional bond coat materials. Chromium additions are also believed to help in the formation of alpha alumina and improve the corrosion resistance of the bond coat.

Notably, the diffusion of chromium (which typically occurs in ranges of about 0.5 to 2 atomic percent) from superalloy substrates into prior art bond coats has been viewed as detrimental to TBC spallation resistance on the basis of encouraging the growth rate of aluminum oxide and nonadherent oxides at the bond coat-ceramic layer interface. Nonetheless, the present invention intentionally alloys a beta-phase NiAl bond coat with chromium additions to levels higher than 2 atomic percent unexpectedly improve the spallation resistance of a TBC system.

According to this invention, zirconium in the NiAl overlay coating 24 of this invention preferentially oxidizes at the coating surface, forming "pegs" that increase the mechanical integrity of the alumina scale 28 that forms on the coating 24. These pegs create an irregular or roughened surface that increases the extrinsic resistance to crack propagation at the bond coat-TBC interface by providing a tortuous crack path. Zirconium is further believed to improve the creep resistance of the coating 24.

During an investigation leading to this invention, tests were performed on NiAl+Zr+Cr overlay coatings 24 that evidenced improvements over baseline PtAl diffusion coatings in terms of TBC spallation and environmental (CHC/O) resistance. The tests showed that such improvements can be achieved with up to 1.2 at. % zirconium, and that the further addition of chromium leads to an unexpected additional improvement in TBC spallation and CHC/O performance. Suitable compositional ranges for zirconium and chromium were established through the testing of overlay coatings deposited by electron beam-physical vapor deposition (EB-PVD) and high velocity oxyfuel (HVOF) thermal spraying of powders.

Figure 3:
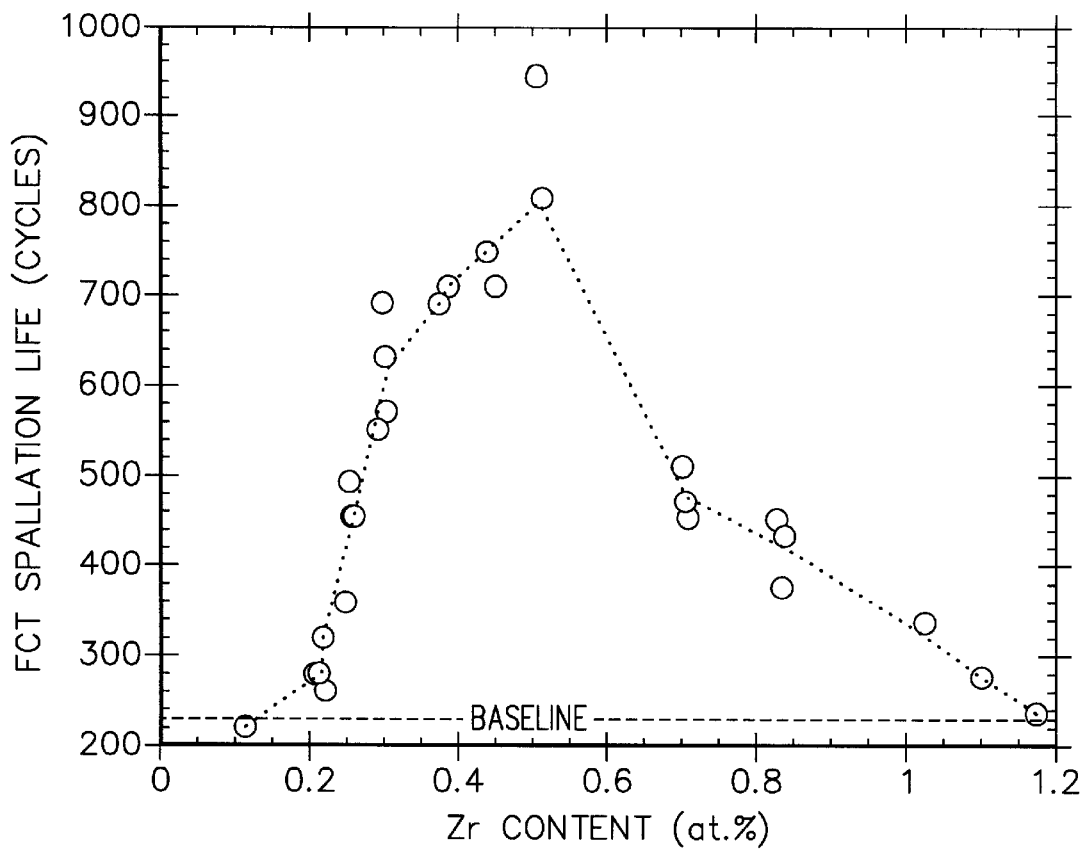
FIG. 3 is a graph illustrating the relative furnace cycle test spallation performance of NiAl intermetallic bond coats alloyed in accordance with this invention to contain 5 at. % chromium and 0.1 to 1.2 at. % zirconium.

In a first experiment, EBPVD techniques were used to deposit NiAl+Zr+Cr overlay coatings on six sets of furnace cycle test (FCT) buttons made from Rene N5 single-crystal superalloy, having a nominal composition, in weight percent, of 7.5% Co, 7.0% Cr, 6.5% Ta, 6.2% Al, 5.0% W, 3.0% Re, 1.5% Mo, 0.15% Hf, 0.05% C, 0.004% B, 0.01% Y, the balance nickel. The EBPVD parameters were adjusted to vary the zirconium content from one button set to another, while maintaining chromium levels of about 5 at. %. After depositing approximately two mils (about 50 micrometers) of NiAl+Zr+Cr overlay coating material, the specimens were subjected to a vacuum diffusion heat treatment at about 2000° F. (about 1090° C.) for two hours, and then coated by EBPVD with about five mils (about 125 micrometers) of 7% YSZ as a thermal barrier coating (TBC) material. The spallation life potentials of these coating systems were then evaluated by FCT at about 2125° F. (about 1160° C.) with one hour cycles. The results of this experiment are plotted in FIG. 3. The spallation resistance of the YSZ TBC is shown to be strongly influenced by zirconium concentration. FCT lives exceeding the PtAl baseline performance (230 cycles) were observed for zirconium levels of about 0.2 to 1.2 at. % zirconium, and particularly for levels of about 0.3 to about 0.7 at. %.

In a second experiment designed to evaluate the role of chromium and zirconium chemistry variations on the environmental performance of beta-phase NiAl overlay coatings, chromium levels of 2, 5 and 10 at. % and zirconium levels of 0.1, 0.3, 0.5, and 0.7 at. % were evaluated in a full factorial design of experiment (DOE). The ratio of aluminum to nickel atomic concentrations in the powders was maintained at about 1:1 for all powders investigated. The twelve possible combinations established by the chromium and zirconium ranges were formed as powders and sprayed by HVOF on test specimens. Coatings two mils (about 50 micrometers) in thickness were applied to René N5 pin specimens (3.5 inches long and 0.25 inches diameter; about 9 cm long by about 6.35 mm diameter). After a vacuum diffusion heat treatment at about 1975° F. (about 1080° C.) for two hours, the NiAl overlay coatings were hand-finished to reduce surface roughness. Half of the pins were then coated with about five mils (about 125 micrometers) of 7% YSZ by EBPVD. The TBC-coated pins were then subjected to burner rig testing for TBC spallation as overlay bond coats, while the TBC-free pins were subjected to burner rig testing with fuel contaminated with sea salt to evaluate the environmental properties of the NiAl+Zr+Cr compositions as environmental overlay coatings. The results of these tests are summarized in FIGS. 4 and 5, respectively.

Figure 4:
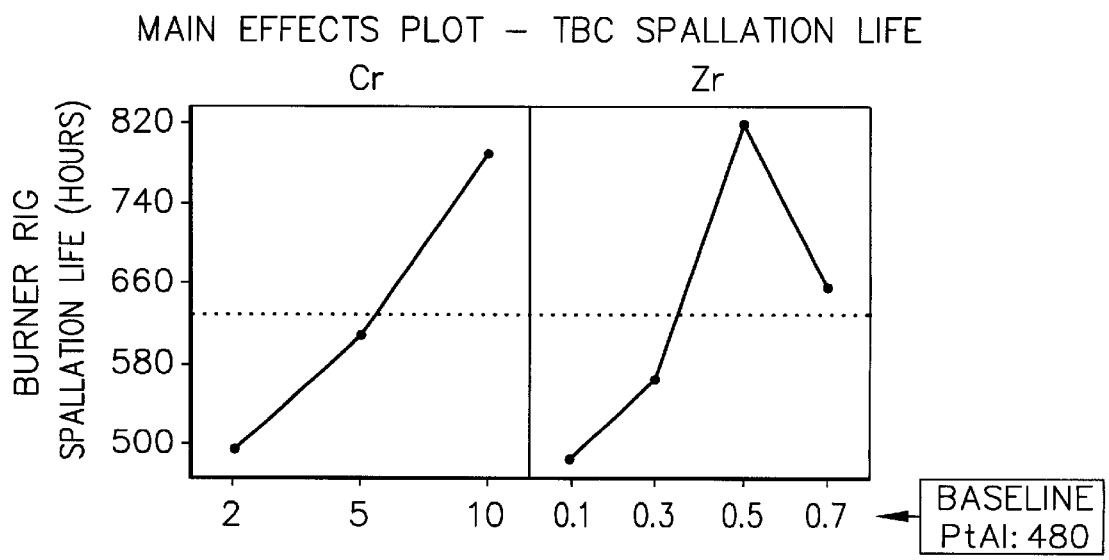
FIGS. 4 and 5 are main effects plots that evidence the effect of chromium and zirconium combinations on the TBC spallation resistance and the cyclic hot corrosion/oxidation (CHC/O) resistance of burner rig superalloy specimens having NiAl intermetallic overlay bond coats alloyed in accordance with this invention to contain 2 to 10 at. % chromium and 0.1 to 0.7 at. % zirconium.

The burner rig TBC spallation experiment with the TBC-coated specimens was conducted at Mach 0.5 gas velocity and at pin temperatures cycled between about 200° F. and 2075° F. (about 93° C. and about 1135° C.) using cycles comprised of a five minute hold at peak temperature and 75 seconds of forced air cooling to below 200° F. (about 93° C.). The number of cycles to TBC failure (identified as the spallation of any amount of TBC) was recorded. FIG. 4 is a "main effects" plot of zirconium and chromium chemistry concentration on TBC spallation life. A main effects plot was chosen as the simplest means to compare the average effects of separate variables on an outcome. In FIG. 4, for instance, the average performance for specimens containing about 10 at. % chromium (at all zirconium levels) was considerably higher than those with only 2 at. % chromium (at all zirconium levels). Similarly, coatings with 0.5 at. % zirconium (at all chromium levels) performed better than coatings with 0.1, 0.3 and 0.7 at. % zirconium (at all chromium levels).

As is evident from FIG. 4, both zirconium and chromium have a clear effect on performance, as indicated by longer life with increasing concentrations of both elements, especially zirconium at levels between 0.3 to 0.7 at. %, and particular around 0.5 at. %. The effect of chromium is evident at all levels from 2 to 10 at. %. The main effects plot of FIG. 4 and the raw data that produced the plot indicated that the coatings with the longest lives contained a combination of 10 at. % chromium and 0.5 at. % zirconium. Coatings with more or less zirconium and less chromium did not perform as well. The plot also displays strong evidence by extrapolation that the lack of chromium (i.e., 0 at. % chromium) would lead to lower performance than the tested combinations of chromium and zirconium. Consequently, this investigation evidenced that the tested combinations of zirconium and chromium provide better spallation performance than if either element were used alone.

The data also indicates the trend that zirconium concentrations of more than 0.7 at. % should perform better than baseline PtAl bond coats, as will chromium levels of more than 10 at. %. From this investigation, it was concluded that zirconium levels of about 0.1 to about 1.2 at. % and chromium levels of about 2 to about 15 at. % should be operable ranges to meet or exceed the performance of PtAl diffusion bond coats.

Figure 5:
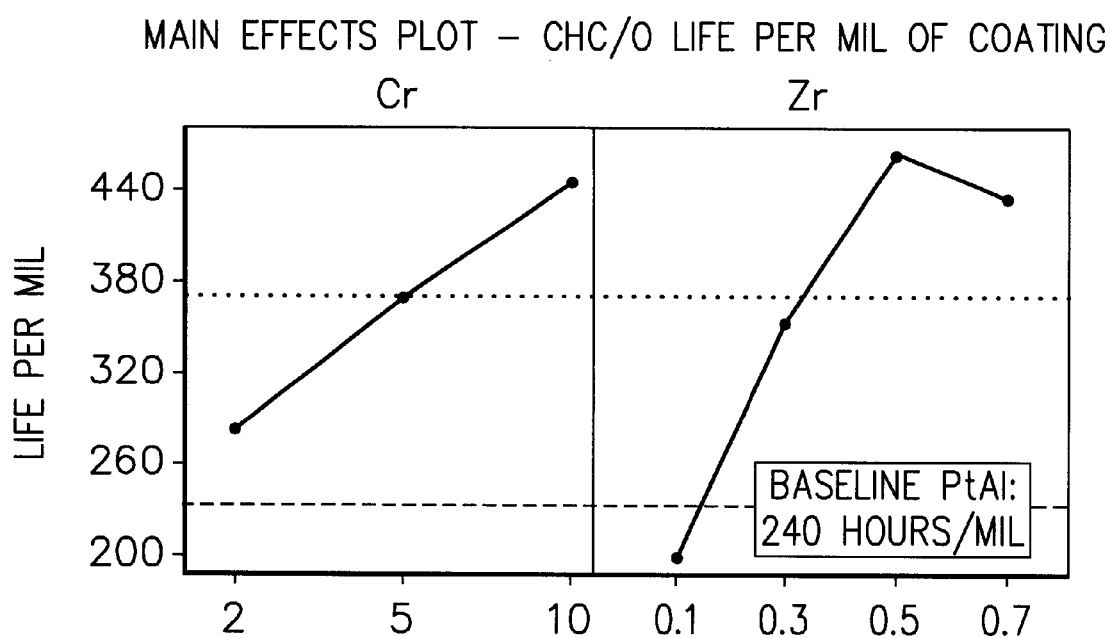

Finally, a burner rig CHC/O test was conducted with the twelve TBC-free NiAl+Zr+Cr overlay coatings deposited by HVOF. These specimens were subjected to a Mach 0.5 flame and a continuous thermal cycle between about 2075° F. (about 1135° C.) for five minutes and about 1700° F. (about 925° C.) for ten minutes, all while injecting 1 ppm sea salt into the fuel to achieve hot-corrosion. The time in hours required for the coating to be removed by environmental attack at any location was recorded. Subsequent metallographic analysis revealed the initial thickness of the coating, from which the life per mil (per about 25 micrometers) of coating was calculated. FIG. 5 is a Main Effects plot of zirconium and chromium chemistry concentration on CHC/O life. The effects of the zirconium and chromium concentrations are similar to that seen in FIG. 4, in that both zirconium and chromium were required for full performance benefits to be realized. FIG. 5 further emphasizes the need to have both zirconium and chromium in the coating to achieve improved performance beyond what is possible with zirconium additions alone. Specifically, without chromium (0 at. %), the performance would be expected to be lower that the results obtained with a 2 at. % chromium level, no matter what the zirconium concentration (0.1 to 0.7 at. %) is of the coating.

While the invention has been described in terms of a preferred embodiment, it is apparent that other forms could be adopted by one skilled in the art. Accordingly, the scope of the invention is to be limited only by the following claims.

What is claimed is:

1. A coating system on a superalloy substrate, the coating system comprising a beta-phase NiAl intermetallic overlay layer consisting of, in atomic percent, 30% to 60% aluminum, 2% to 15% chromium, 0.1% to 1.2% zirconium, and the balance essentially nickel.

2. A coating system according to claim 1, further comprising a thermal-insulating ceramic layer adhered to the overlay layer.

3. A coating system according to claim 1, wherein the zirconium content of the overlay layer is 0.3 to 0.7 atomic percent.

4. A coating system according to claim 1, wherein the zirconium content of the overlay layer is about 0.5 atomic percent.

5. A coating system according to claim 1, wherein the chromium content of the overlay layer is 2 to 10 atomic percent.

6. A coating system according to claim 1, wherein the chromium content of the overlay layer is at least 5 atomic percent.

7. A coating system according to claim 1, wherein nickel and aluminum are present in the overlay layer in approximately equal amounts.

8. A coating system on a superalloy substrate, the coating system comprising a ceramic layer on a beta-phase NiAl intermetallic overlay bond coat, the overlay bond coat consisting of, in atomic percent, 30% to 50% aluminum, 2% to 15% chromium, 0.1% to 1.2% zirconium, and the balance essentially nickel.

9. A coating system according to claim 8, wherein the zirconium content of the overlay bond coat is 0.3 to 0.7 atomic percent.

10. A coating system according to claim 8, wherein the zirconium content of the overlay bond coat is about 0.5 atomic percent.

11. A coating system according to claim 8, wherein the chromium content of the overlay bond coat is 2 to 10 atomic percent.

12. A coating system according to claim 8, wherein the chromium content of the overlay bond coat is at least 5 atomic percent.

13. A coating system according to claim 8, wherein the overlay bond coat consists of, in atomic percent, 2% to 10% chromium, 0.2% to 1.2% zirconium, the balance essentially nickel and aluminum in approximately equal amounts.

14. A coating system according to claim 8, wherein the overlay bond coat consists of, in atomic percent, 5% to 10% chromium, 0.3% to 0.7% zirconium, the balance essentially nickel and aluminum in approximately equal amounts.

15. A coating system according to claim 8, wherein nickel and aluminum are present in the overlay bond coat in approximately equal amounts.

16. A coating system according to claim 8, wherein the ceramic layer is yttria-stabilized zirconia.

* * * * *